United States Patent [19]

Kaneko et al.

[11] Patent Number: 4,686,494

[45] Date of Patent: Aug. 11, 1987

[54] CAVITY RESONATOR COUPLING TYPE POWER DISTRIBUTOR/POWER COMBINER COMPRISING COUPLED INPUT AND OUTPUT CAVITY RESONATORS

[75] Inventors: Yoshiaki Kaneko, Yokohama; Toshiyuki Saito; Naofumi Okubo, both of Kawasaki, all of Japan

[73] Assignee: Fujitsu Limited, Kawasaki, Japan

[21] Appl. No.: 571,811

[22] Filed: Jan. 18, 1984

[30] Foreign Application Priority Data

| | | | |
|---|---|---|---|
| Jan. 26, 1983 | [JP] | Japan | 58-011063 |
| Jan. 26, 1983 | [JP] | Japan | 58-011064 |

[51] Int. Cl.[4] .......... H01P 7/06; H03H 7/48

[52] U.S. Cl. .......... 333/137; 333/230; 333/231; 330/286; 330/295

[58] Field of Search .......... 333/136-137, 333/125, 127, 128, 219, 227, 230, 231, 235, 134, 135; 330/286, 295, 56; 331/56, 96, 107 DP

[56] References Cited

U.S. PATENT DOCUMENTS

| | | | |
|---|---|---|---|
| 2,496,772 | 2/1950 | Bradley | 333/227 |
| 2,796,587 | 6/1957 | Phillips | 333/33 |
| 3,156,879 | 11/1964 | Hess | 333/136 |
| 3,308,402 | 3/1967 | Grande | 333/230 |
| 4,143,334 | 3/1979 | Dydyk | 331/56 |
| 4,147,994 | 4/1979 | Thoren et al. | 331/56 |
| 4,291,288 | 9/1981 | Young et al. | 333/230 X |

FOREIGN PATENT DOCUMENTS

| | | | |
|---|---|---|---|
| 0059927 | 9/1982 | European Pat. Off. . | |
| 1223966 | 9/1966 | Fed. Rep. of Germany . | |
| 2038491 | 1/1971 | France . | |
| 2447605 | 8/1980 | France . | |
| 0134504 | 8/1983 | Japan | 333/127 |
| 0467534 | 5/1976 | U.S.S.R. | 333/134 |

OTHER PUBLICATIONS

"A 1 $KW_{peak}$, 300 $W_{avg}$ IMPATT Diode Injection Locked Oscillator", C. A. Drubin et al., 1982 IEEE MTT-S International Microwave Symposium Digest, Jun. 15-17, 1982, pp. 126-128, Dallas, Texas.

European Search Report, for EP 84-300428, Exr. Laurel, The Hague, 12/11/1985.

"A 6-GHz, 80-W GaAs FET Amplifier with TM-Mode Cavity Power Combiner", N. Okubo et al., 1983 IEEE MTT-S International Microwave Symposium Digest, May 31-Jun. 3, 1983, Boston, Massachusetts, pp. 276-278.

*Primary Examiner*—Eugene R. LaRoche
*Assistant Examiner*—Benny T. Lee
*Attorney, Agent, or Firm*—Staas & Halsey

[57] ABSTRACT

A cavity resonator coupling type power distributor/power combiner can be used as a distributing amplifier or a combining unit. A first cavity resonator, having a single coupling terminal, and a second cavity resonator having a plurality of coupling terminals, are coupled by a coupling window or a coupling rod. As a result, a wide bandwidth of microwave electric power can be distributed or combined.

25 Claims, 10 Drawing Figures

CAVITY RESONATOR COUPLING TYPE POWER DISTRIBUTOR/POWER COMBINER COMPRISING COUPLED INPUT AND OUTPUT CAVITY RESONATORS

BACKGROUND OF THE INVENTION

1. Field of the Invention

The present invention relates to a cavity resonator coupling type power distributor/power combiner. More particularly, it relates to a distributor/combiner of a cavity resonator coupling type for distributing or combining microwave electric power between a single coupling terminal and a plurality of coupling terminals.

2. Description of the Prior Art

In recent years, attempts have been made to use semiconductor amplifier elements, such as gallium-arsenide (GaAs) field effect transistors (FET's) instead of conventional traveling-wave tubes to amplify signals in the microwave band. The semiconductor amplifier element, however, has an output power of several watts at the greatest, and when it is necessary to amplify a high frequency signal with a large electric power, such elements must be operated in parallel. Because of this, it is an accepted practice to distribute input signals in the microwave band into a plurality of channels by a microwave distributor, amplify the signals of each channel by the above-mentioned semiconductor amplifier element and then combine the amplified output signals in each of the channels into a signal in one channel by a microwave combiner, thereby obtaining a high frequency signal with large electric power. The electric power, however, is lost when the phases and the amplitudes of the microwave electric power distributed by the microwave distributor are not in agreement, or when the microwave electric power is not combined in phase and in equal amplitude by the microwave combiner. It is, therefore, desired that the phases and the amplitudes of microwave signals be uniformly distributed in the microwave distributor and in the microwave combiner. It is also necessary that the distributor and the combiner lose as little electric power as possible.

A cavity resonator may be effectively used as a distributor or a combiner because it can provide a high coincidence of both phase and electric power between the input and the output thereof. Conventionally, only a single cavity resonator is used. A single cavity resonator, however, has a very narrow bandwidth which limits its use in a distributor or a combiner. Therefore, a single cavity resonator cannot be practically used as a distributor or a combiner.

SUMMARY OF THE INVENTION

An object of the present invention is to provide a cavity resonator coupling type power distributor/power combiner which can distribute or combine microwave electric power with a wide bandwidth.

Another object of the present invention is to provide a cavity resonator coupling type power distributor/power combiner in which two cavity resonators are electromagneticaly coupled and whereby the coupling coefficient between the two cavity resonators and the resonant frequency of one of the two resonators can be easily adjusted.

To attain the above objects, there is provided a cavity resonator coupling type power distributor/power combiner which can function as either a distributing amplifier or a combining unit. The power distributor/power combiner includes a first cavity resonator having a single coupling terminal, a second cavity resonator having a plurality of coupling terminals and a coupling means for electromagnetically coupling the second cavity resonator with the first cavity resonator.

BRIEF DESCRIPTION OF THE DRAWINGS

The above objects and features as well as other features and advantages of the present invention will be more apparent from the following description of the preferred embodiment with reference to the accompanying drawings, wherein.

DESCRIPTION OF THE PREFERRED EMBODIMENTS

Figure 1:
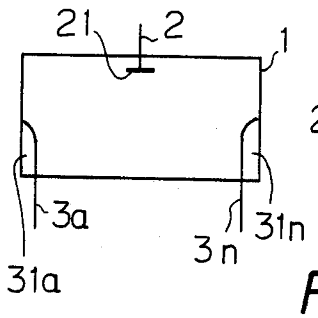
Fig. 1 PRIOR ART
FIG. 1 is a cross-sectional view of a conventional power distributor/power combiner employing a single cavity resonator.

Before describing the preferred embodiments of the present invention, a conventional cavity resonator will be described with reference to FIGS. 1 and 2. FIG. 1 is a cross-sectional view of a conventional power distributor/power combiner. In FIG. 1, a cavity resonator 1, for example, a cylindrical type, has a single coupling terminal 2 and a plurality of coupling terminals 3*a* to 3*n*. The single coupling terminal 2 has a disk-type antenna 21 for establishing an electric field coupling between the coupling terminal 2 and the cavity resonator 1. The coupling terminals 3*a* to 3*n* respectively have magnetic field coupling loops 31*a* to 31*n* for establishing a magnetic field coupling between the cavity resonator 1 and the coupling terminals 3*a* to 3*n*. When microwave electric power is supplied to the coupling terminal 2, the microwave electric power is distributed to and outputted from the coupling terminals 3*a* to 3*n*. In this case, the cavity resonator 1 functions as a power distributor.

When microwave electric power is supplied to the coupling terminals 3*a* to 3*n*, the electric power is combined and then, outputted from the single coupling terminal 2. In this case, the cavity resonator 1 functions as a power combiner.

Figure 2:
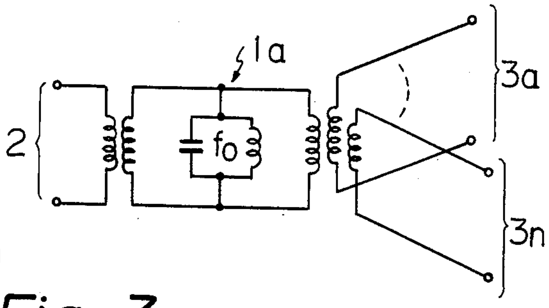
Fig. 2 PRIOR ART
FIG. 2 is an equivalent circuit diagram of the power distributor/power combiner illustrated in FIG. 1.
Figure 5:
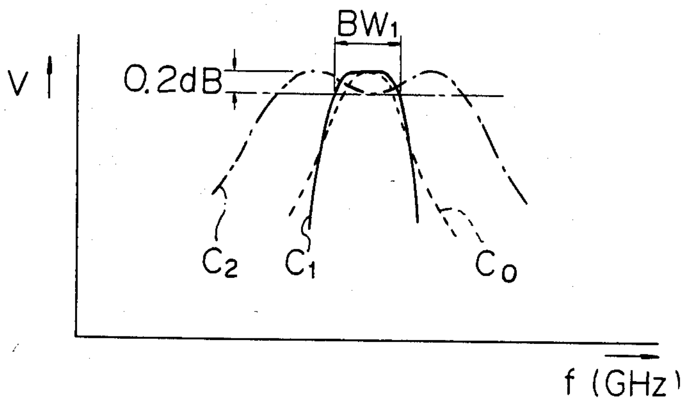
FIG. 5 is a graph of the frequency-voltage characteristics of the conventional power distributor/power combiner illustrated in FIG. 1 and of the cavity resonator coupling type power distributor/power combiner illustrated in FIG. 3.

FIG. 2 is an equivalent circuit diagram of the power distributor/power combiner illustrated in FIG. 1. In FIG. 2, between the single coupling terminal 2 and the plurality of coupling terminals 3*a* to 3*n*, a resonance circuit 1*a* having a resonance frequency $f_0$ is connected. The frequency characteristic of the cavity resonator 1 is determined by the frequency characteristic of the resonance circuit 1*a*. The resonance circuit 1*a* has, by its character, a very narrow bandwidth, as illustrated in FIG. 5 by a broken curve $C_0$. Therefore, the single cavity resonator 1 illustrated in FIG. 1 will pass only a very narrow bandwidth of microwave electric power. Such a narrow bandwidth is not practical for use in a power distributor or a power combiner.

Figure 3:
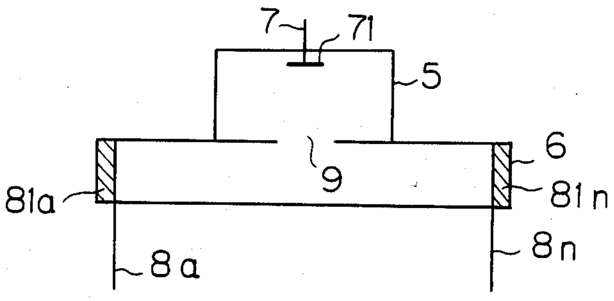
FIG. 3 is a cross-sectional view of a cavity resonator coupling type power distributor/power combiner, according to an embodiment of the present invention.

Embodiments of the present invention will now be described. FIG. 3 is a cross-sectional view of a cavity resonator coupling type power distributor/power combiner according to a first embodiment of the present invention. In FIG. 3, two cavity resonators 5 and 6 are electromagnetically coupled through a coupling window 9. The first cavity resonator 5 has a single coupling terminal 7 on its upper side. The single coupling terminal 7 has, on one end, an antenna 71 for establishing an electric field coupling between the single coupling terminal 7 and the first cavity resonator 5. The second cavity resonator 6 has a plurality of coupling terminals 8*a* to 8*n* on its bottom side. The coupling terminals 8*a* to 8*n* respectively have magnetic field coupling loops 81*a* to 81*n* for establishing a magnetic field coupling between the second cavity resonator 6 and the coupling terminals 8*a* to 8*n*.

The top plan view of the first cavity resonator 5 may have any desired shape, such as a rectangle, hexagon or circle. Preferably, the first cavity resonator 5 has a cylindrical shape, and the second cavity resonator 6 also has a cylindrical shape.

Generally, the resonant mode in the first and second cavity resonators 5 and 6 when they are of a cylindrical type can be expressed as $TE_{\theta,r,z}$ or $TM_{\theta,r,z}$, where $\theta$, r, and z are components in the cylindrical coordinate expression. The transverse field pattern in a cylindrical cavity resonator is similar to that of the $TE_{\theta,r}$ mode or $TM_{\theta,r}$ mode in a cylindrical waveguide where z is the number of half-period field variations along the axis. The $TM_{0,m,0}$ mode, where m is a positive integer, is suitable for use in the cavity resonator coupling type power distributor/power combiner because it is easy to separate the associated mode from other undesired resonant modes. The $TM_{0,m,0}$ mode means that the magnetic field in the azimuthal direction $\theta$ and in the axial direction z is constant. In one example, the first cavity resonator 5 has a cylindrical shape and resonates with a $TM_{0,1,0}$ mode. The cylindrical type second cavity resonator 6 resonates with, in this example, a $TM_{0,2,0}$ mode. Since the first cavity resonator 5 and the second cavity resonator 6 are electromagnetically coupled with each other through the coupling window 9, the device illustrated in FIG. 3 functions as a power distributor when microwave electric power is supplied to the single coupling terminal 7, so that distributed electric power is outputted from the coupling terminals 8*a* to 8*n*. Also, when microwave electric power is supplied to the coupling terminals 8*a* to 8*n*, the device in FIG. 3 functions as a power combiner, so that combined electric power is outputted from the single coupling terminal 7.

Figure 4:
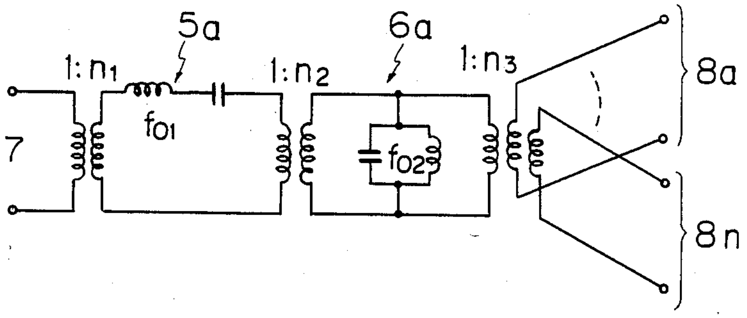
FIG. 4 is an equivalent circuit diagram of the cavity-resonator coupling type power distributor/power combiner illustrated in FIG. 3.

FIG. 4 is an equivalent circuit diagram of the device illustrated in FIG. 3. In FIG. 4, the first cavity resonator 5 has a series resonant circuit 5*a* having a resonance frequency $f_{01}$. The second cavity resonator 6 has a resonance circuit 6*a* having a resonance frequency $f_{02}$. The difference between the resonance frequencies $f_{01}$ and $f_{02}$ may be zero or may be a predetermined value, depending on the sizes of the cavity resonators 5 and 6. A coupling coefficient $n_1$ between the single coupling terminal 7 and the cavity resonator 5 is determined depending on the size and the position of the antenna 71. A coupling coefficient $n_2$ between the first cavity resonator 5 and the second cavity resonator 6 is determined by the size of the coupling window 9. A coupling coefficient $n_3$ between the second cavity resonator 6 and the plural terminals 8*a* to 8*n* is determined depending on the size of magnetic field coupling loops 81*a* to 81*n* and the diameter of the conductors constituting the coupling terminals 8*a* and 8*n*. The size of each magnetic field coupling loop 81*a*–81*n* corresponds to the hatched area surrounded by each conductor 8*a* to 8*n* and the sides of the second cavity resonator 6.

FIG. 5 is a graph of the frequency-voltage characteristics of the conventional device illustrated in FIG. 1 and of the device illustrated in FIG. 3. In FIG. 5, the broken curve $C_0$ represents the conventional frequency-voltage characteristic realized by the single cavity resonator illustrated in FIG. 1; a solid curve $C_1$ represents a frequency-voltage characteristic realized by the device illustrated in FIG. 3 when the resonance frequency $f_{01}$ is equal to the resonance frequency $f_{02}$ under the condition that the coupling coefficient $n_2$ between the first and the second cavity resonators is relatively small; and a dash-dot curve $C_2$ shows a frequency-voltage characteristic realized by the device illustrated in FIG. 3 when the resonance frequency $f_{01}$ is different from the resonance frequency $f_{02}$ or when the resonance frequencies $f_{01}$ and $f_{02}$ are equal under the condition that the coupling coefficient $n_2$ is relatively large. As illustrated in FIG. 5, the solid curve $C_1$ has a wider flat bandwidth $BW_1$ than the bandwidth of the broken curve $C_0$ for the upper 0.2 dB of the output voltage. The flat bandwidth, i.e., a 0.2 dB-bandwidth, for the cavity resonator coupling type power distributor/power combiner illustrated in FIG. 3 can be expected to be about twice as wide as that of the conventional single cavity resonator illustrated in FIG. 1, while a 3-dB bandwidth is smaller by $1/\sqrt{2}$.

When the resonance frequency $f_{01}$ is different from the resonance frequency $f_{02}$, or when the resonance frequencies $f_{01}$ and $f_{02}$ are equal to each other but the coupling coefficient $n_2$ is greater than that in the case of the curve $C_1$, the dash-dot curve $C_2$, which is a double-humped resonance curve, can be obtained, so that the bandwidth is expanded.

As can be seen from the above, since the conventional curve $C_0$ is a single-humped resonance curve, its bandwidth cannot be increased.

Figure 6:
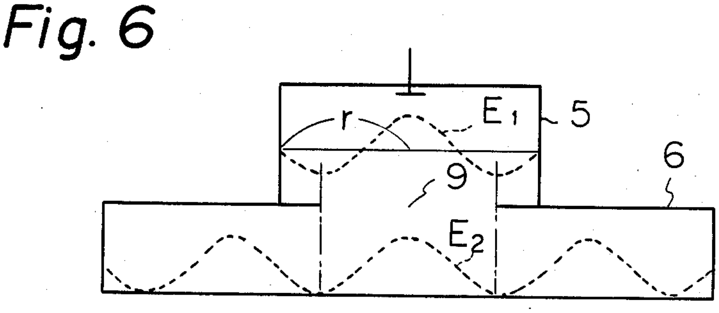
FIG. 6 is a cross-sectional view of the power distributor/power combiner illustrated in FIG. 3, depicting an example of the configuration of the electric field therein.

FIG. 6 is an example of the configuration of the electric field in the device illustrated in FIG. 3. In FIG. 6, it is assumed that the first cavity resonator 5 is of a cylindrical type and resonates with a $TM_{0,2,0}$ mode to obtain an electric field $E_1$. The intensity of the electric field $E_1$ at the side wall of the resonator 5 is zero. At the center of the resonator 5, the intensity of the electric field $E_1$ is maximum. At a position distant from the center of the resonator 5 by 0.694r, where r is the radius of the first cavity resonator 5, the intensity of the electric field $E_1$ is a local maximum. The coupling window 9 has a diameter equal to 0.694r. More generally, the diameter of the coupling window 9 is to be equal to the distance between two positions where the intensity of the electric field in the first cavity resonator has peak values, the two positions being symmetric with respect to the center of the first cavity resonator. By forming the coupling window 9 as mentioned above, the second cavity resonator 6 resonates with the same configuration of electric field $E_2$ as the electric field $E_1$.

The size of the second cavity resonator 6 is determined so that the intensity of the electric field $E_2$ at the side wall of the second cavity resonator 6 is zero. Since the second cavity resonator 6 has the plurality of coupling terminals 8*a* to 8*n*, the radius of the second cavity resonator 6 is made larger than the radius of the first cavity resonator 5.

In this example, the coupling coefficient between the first cavity resonator 5 and the second cavity resonator 6 can be large without the generation of undesired modes in the first and the second cavity resonators 5 and 6. Therefore, in this example, disturbance of the electric field and the generation of higher order modes can be prevented, so that the distribution or combination of microwave electric power can be stably carried out. This type of coupling is referred to as mode coupling. Mode coupling can be realized not only by the above described $TM_{0,2,0}$ mode, but also by any mode type among the $TM_{\theta,r,z}$ modes and the $TE_{\theta,r,z}$ modes.

Figure 7:
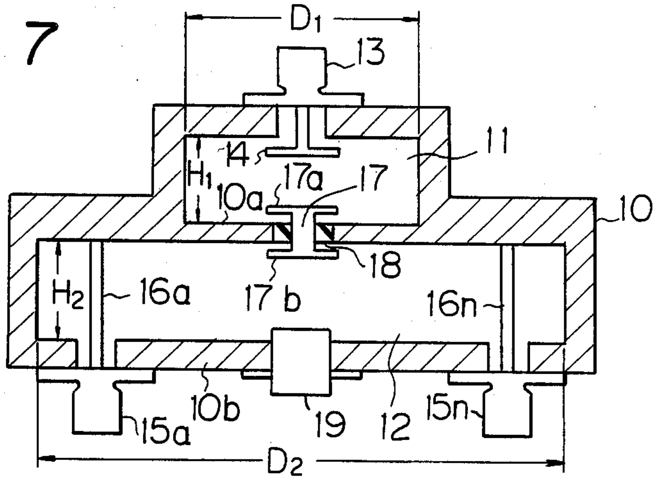
FIG. 7 is a cross-sectional view of a cavity-resonator coupling type power distributor/power combiner, according to another embodiment of the present invention.

FIG. 7 is a general cross-sectional view of a cavity-resonator coupling type power distributor/power combiner, according to a second embodiment of the present invention. In FIG. 7, a housing 10 made of metal constitutes a power distributor/power combiner. The power distributor/power combiner is constructed by a first cavity resonator 11 and a second cavity resonator 12. The first cavity resonator 11 has, at its top surface, a single coupling terminal 13. The single coupling terminal 13 is connected to a disk shaped antenna 14 for establishing an electric field coupling between the single coupling terminal 13 and the first cavity resonator 11. The second cavity resonator 12 has, at its bottom plate 10*b*, a plurality of coupling terminals 15*a* to 15*n*. In the second cavity resonator 12, a plurality of antennas 16*a* to 16*n* are respectively connected to the coupling terminals 15*a* to 15*n*. The antennas 16*a* to 16*n* function to establish a magnetic field coupling between the second cavity resonator 12 and the coupling terminals 15*a* to 15*n*. In this embodiment, the electromagnetic coupling between the first cavity resonator 11 and the second cavity resonator 12 is established by a coupling rod 17, instead of the coupling window 9 in the first embodiment. The second cavity resonator 12 also has, at the center of the bottom plate 10*b*, an adjusting screw 19 for controlling the resonance frequency of the second cavity resonator 12. The coupling rod 17 is fixed to the bottom metal plate 10*a* of the first cavity resonator 11 through a dielectric supporting member 18. The bottom metal plate 10*a* also functions as the top surface of the second cavity resonator 12. The bottom metal plate or the top surface 10*a* is a part of the metal housing 10. The dielectric supporting member 18 has, at its center, a hole for the coupling rod 17. The coupling rod 17, has at each end, a disk type antenna 17*a* and a disk type antenna 17*b*, projecting into the first and the second cavity resonators 11 and 12, respectively, for establishing an electric field coupling between the first cavity resonator 11 and the coupling rod 17, and between the coupling rod 17 and the second cavity resonator 12, respectively. The adjusting screw 19 for adjusting the resonance frequency of the second cavity resonator 12 is provided at the center of the bottom surface 10*b* of the housing 10, i.e., at the center of the second cavity resonator 12. The height $H_1$ of the first cavity resonator 11 is 8 mm and the diameter $D_1$ is 36 mm. The first cavity resonator 11 operates in the $TM_{0,1,0}$ mode. The height $H_2$ and the diameter $D_2$ of the second cavity resonator 12 are 8 mm and 83 mm, respectively. The second cavity resonator 12 operates in the $TM_{0,2,0}$ mode. A power distributor/-power combiner, having the construction described above, can provide a 0.2 dB bandwidth of 600 MHz at 6 GHz, while the conventional single cavity resonator 1 illustrated in FIG. 1 can provide only a 0.2 dB bandwidth of 300 MHz. Thus, according to this embodiment, the 0.2 dB bandwidth is about twice that of the conventional device.

In the second embodiment in FIG. 7, since the first cavity resonator 11 is coupled with the second cavity resonator 12 with respect to the electric field by means of the coupling rod 17 having the antennas 17*a* and 17*b*, the hole for the rod 17 can be made very small in comparison with the window 9 in the first embodiment in FIG. 3. Therefore, the electric field is not disturbed due to the window 9 and the coupling between the first and the second cavity resonators 11 and 12 can be made much stronger than in the first embodiment. The coupling coefficient between the first and the second cavity resonators 11 and 12 is determined by the size and the position of the antennas 17*a* and 17*b* of the coupling rod 17. Therefore, in order to change the coupling coefficient, it is necessary to replace the coupling rod 17 with another coupling rod. To do this, it is necessary to disassemble the first and the second cavity resonators 11 and 12. Accordingly, adjustment of the coupling coeffcient is not easy, while the adjustment of the resonance frequency can be performed easily by means of the adjusting screw 19. Instead of the disk type antennas 17*a* and 17*b*, rod antennas may also be used.

Figure 8:
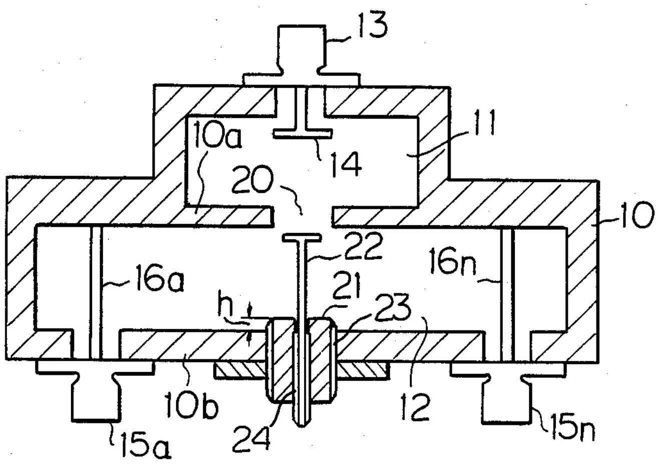
FIG. 8 is a cross-sectional view of a cavity resonator coupling type power distributor/power combiner, according to still another embodiment of the present invention.

In the third embodiment illustrated in FIG. 8, adjustment of the coupling coefficient is much easier. In FIG. 8, the same portions as those in FIG. 7 are designated by the same reference characters or the same reference numerals. Reference numeral 20 designates a coupling window, 21 an adjusting screw for adjusting the resonance frequency of the second cavity resonator 12 and 22 an adjusting antenna for adjusting the coupling coefficient between the first cavity resonator 11 and the second cavity resonator 12, respectively. The bottom plate 10*b* of the housing 10 has, at its center, a tapped hole 23. The adjusting screw 21 is screwed and fixed through the tapped hole 23 to the bottom plate 10*b*.

Figure 9:
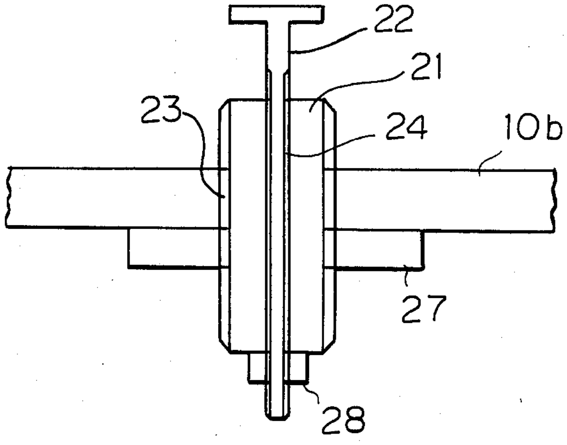
FIG. 9 is a partial detailed cross-sectional view of FIG. 8.

The resonance frequency can be controlled by the height h by which the adjusting screw 21 projects inside of the second cavity resonator 12. The adjusting screw 21 has, at its center, a tapped hole 24 through which the antenna 22 is screwed and fixed. The coupling coefficient of the first cavity resonator 11 with the second cavity resonator 12 is determined by adjusting the position of the antenna 22 with respect to the coupling window 20 by screwing the antenna 22 in the tapped hole 24. As a result, the adjustments of the coupling coefficient and of the second cavity's resonance frequency can be carried out easily without disassembling the cavity resonators of the microwave power distributor/power combiner in this third embodiment. A more detailed structure of the adjusting screw 21 and the adjusting antenna 22 is illustrated in FIG. 9. In FIG. 9, reference numerals 27 and 28 represent locking nuts for tightly fixing the adjusting screw 21 and the antenna 22 to the bottom plate 10*b*, and to the adjusting screw 21, respectively.

Figure 10:
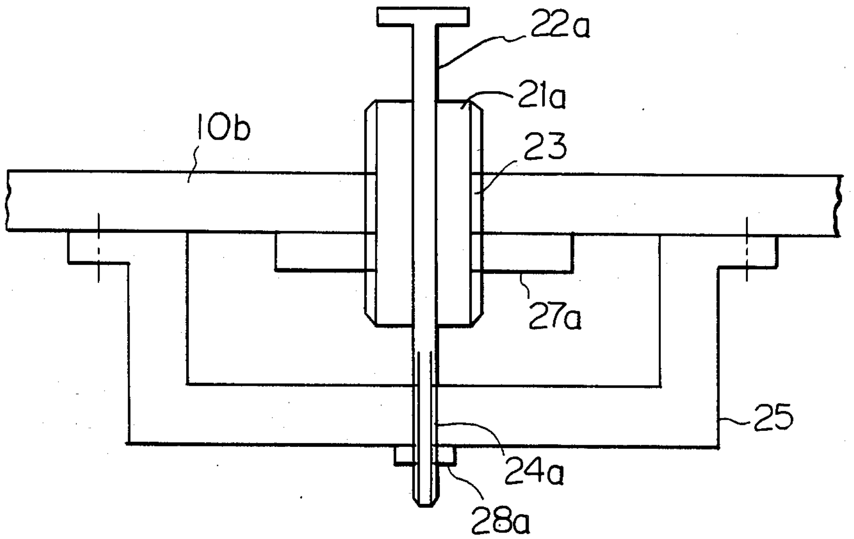
FIG. 10 is a partial cross-sectional view of a cavity-resonator coupling type power distributor/power combiner, according to a still further embodiment of the present invention.

The adjusting mechanism of the adjusting screw 21 and the antenna 22 is not restricted to the third embodiment illustrated in FIGS. 8 and 9. Various constructions may be employed according to the present invention. For example, instead of forming the tapped hole 24 in the center of the adjusting screw 21, a supporting member 25 may be fixed under the bottom plate 10*b*, as illustrated in FIG. 10. In FIG. 10, a partial cross-sectional view of a power distributor/power combiner according to the fourth embodiment of the present invention is illustrated. The bottom plate 10*b* of the housing 10 also has, at its center, the tapped hole 23. An adjusting screw 21*a* is screwed and fixed through the tapped hole 23 to the bottom plate 10*b*. The adjusting screw 21*a*, however, does not have the tapped hole 24 as in the embodiment in FIGS. 8 and 9. Instead, the supporting member 25 has, at its center, a tapped hole 24*a*. An antenna 22*a* penetrates through a hole in the center of the adjusting screw 21*a* and is screwed through the tapped hole 24*a* and fixed to to the supporting member 25. In this fourth embodiment, the height of the adjusting screw 21*a* and the position of the antenna 22*a* can be adjusted independently. Reference symbols 27*a* and 28*a* represent locking nuts for tightly fixing the adjusting screw 21*a* and the antenna 22*a* to the bottom plate 10*a* and the supporting member 25, respectively.

In the foregoing embodiments, the coupling between the first cavity resonator and the single coupling terminal and the coupling between the second cavity resonator and the plurality of coupling terminals are described as electric field coupling and magnetic field coupling, respectively. The present invention, however, is not restricted to the above-mentioned coupling. Any type of electromagnetic coupling may be possible without disturbing the electromagnetic field in the cavity resonators.

From the foregoing description, it will be apparent that, according to the present invention, since the first and the second cavity resonators are coupled to distribute or combine power, the bandwidth of the power distributor/power combiner can be made wider than the conventional type. Also, a number of coupling terminals can be easily provided in the second cavity resonator. Further, by designing the size of the coupling window to be equal to the distance between the peak values of the electric field in the cavity resonators, mode coupling can be realised without generating undesired modes, and therefore, power distribution or power combination can be stably carried out. Still further, by providing the adjusting screw and the adjusting antenna, adjustment of the resonance frequency and the coupling coefficient, respectively, between the cavity resonators can be easily carried out.

We claim:

1. A cavity resonator coupling type power distributor/power combiner selectable to function as one of a distributor and a combining unit in conjunction with multiple amplifiers, said power distributor/power combiner comprising:

first cavity resonator means, having a single coupling terminal and an axis, operatively resonating in a first transverse mode with a first resonant frequency;

second cavity resonator means, having a plurality of coupling terminals and having an axis in common with the axis of said first cavity resonator means, operatively resonating in a second transverse mode of a higher order than the first transverse mode and with a second resonant frequency, different than the first resonant frequency, said second cavity resonator means performing electrical distribution or combination symmetrically with respect to the axis; and coupling means, disposed symmetrically with respect to the axis and between said first and second cavity resonator means, for electromagnetically coupling said second cavity resonator means with said first cavity resonator means.

2. A cavity resonator coupling type power distributor/power combiner as set forth in claim 1, wherein said second cavity resonator means has a cylindrical shape and resonates in a $TM_{0,m,0}$ mode, where m is a positive integer.

3. A cavity resonator coupling type power distributor/power combiner as set forth in claim 2, wherein said first cavity resonator means has a cylindrical shape and resonates in a $TM_{0,n,0}$ mode, where n is a positive integer equal to or smaller than m.

4. A cavity resonator coupling type power distributor/power combiner as set forth in claim 2, wherein a metal housing forms said first and second cavity resonator means, and wherein said coupling means comprises:

a metal plate disposed between and separating said first cavity resonator means and said second cavity resonator means, said metal plate being integral with said metal housing of said cavity resonator coupling type power distributor/-power combiner and having a center;

a dielectric supporting member passing through the center of said metal plate and having a center; and a coupling rod passing through the center of said dielectric supporting member and having antennas at each end of said coupling rod for establishing electric field coupling between said first cavity resonator means and said coupling rod and between said second cavity resonator means and said coupling rod.

5. A cavity resonator coupling type power distributor/power combiner as set forth in claim 1, wherein said coupling means comprises a coupling window coupling said first cavity resonator means with said second cavity resonator means.

6. A cavity resonator coupling type power distributor/power combiner as set forth in claim 1, wherein the single coupling terminal of said first cavity resonator means includes an antenna inside said first cavity resonator means for establising electric field coupling.

7. A cavity resonator coupling type power distributor/power combiner as set forth in claim 1, wherein each of the plurality of coupling terminals of said second cavity resonator means includes a magnetic field coupling loop.

8. A cavity resonator coupling type power distributor/power combiner as set forth in claim 1, wherein said coupling means comprises a metal plate forming a bottom metal plate of said first cavity resonator means and a top surface of said second cavity resonator means and having a coupling window coupling said first cavity resonator means with said second cavity resonator means.

9. A cavity resonator coupling type power distributor/power combiner, selectable to function as one of a distributor and a combining unit in conjunction with multiple amplifiers, said power distributor/power combiner comprising:

first cavity resonator means, having a single coupling terminal and an axis, operatively resonating in a first transverse mode;

second cavity resonator means, having a plurality of coupling terminals and having the axis in common with said first cavity resonator means, operatively resonating in a second transverse mode of a higher order than the first transverse mode, said second cavity resonator means performing electrical distribution or combination symmetrically with respect to the axis; and coupling means, disposed symmetrically with respect to the axis and between said first and second cavity resonator means, for electromagnetically coupling said second cavity resonator means with said first cavity resonator means with a coupling coefficient selected to provide a predetermined bandwidth.

10. A cavity resonator coupling type power distributor/power combiner as set forth in claim 9, wherein said second cavity resonator means has a cylindrical shape and resonates in a $TM_{0,m,0}$ mode, where m is a positive integer.

11. A cavity resonator coupling type power distributor power combiner as set forth in claim 10, wherein said first cavity resonator means has a cylindrical shape and resonates in a $TM_{0,n,0}$ mode, where n is a positive integer equal to or smaller than m.

12. A cavity resonator coupling type power distributor/power combiner as set forth in claim 10, wherein a metal housing forms said first and second cavity resonator means, and wherein said coupling means comprises:

a metal plate disposed between and separating said first cavity resonator means and said second cavity resonator means, said metal plate being integral with said metal housing of said cavity resonator coupling type power distributor/power combiner and having a center;

a dielectric supporting member passing through the center of said metal plate and having a center; and a coupling rod passing through the center of said dielectric supporting member and having antennas at each end of said coupling rod for establishing electric field coupling between said first cavity resonator means and said coupling rod and between said second cavity resonator means and said coupling rod.

13. A cavity resonator coupling type power distributor/power combiner as set forth in claim 9, wherein each of the plurality of coupling terminals of said second cavity resonator means includes a magnetic field coupling loop.

14. A cavity resonator coupling type power distributor/power combiner as set forth in claim 9, wherein said coupling means comprises a metal plate forming a bottom surface of said first cavity resonator means and a top surface of said second cavity resonator means and having a coupling window coupling said first cavity resonator means with said second cavity resonator means.

15. A cavity resonator coupling type power distributor/power combiner as set forth in claim 9, wherein said coupling means comprises a coupling window coupling said first cavity resonator means with said second cavity resonator means.

16. A cavity resonator coupling type power distributor/power combiner as set forth in claim 9, wherein the single coupling terminal of said first cavity resonator means includes an antenna inside said first cavity resonator means for establishing electric field coupling.

17. A cavity resonator coupling type power distributor/power combiner selectable to function as one of a distributor and a combining unit in conjunction with multiple amplifiers, said power distributor/power combiner comprising:

first cavity resonator means, having a single coupling terminal, operatively resonating in a first transverse mode with a first resonant frequency;

second cavity resonator means, having a plurality of coupling terminals, operatively resonating in a second transverse mode of a higher order than the first transverse mode and with a second resonant frequency, different than the first resonant frequency, said second cavity resonator means comprising:

partial enclosure means for partially enclosing a cavity; and a bottom plate, abutting said partial enclosure means, for substantially completing enclosure of the cavity partially enclosed by said partial enclosure means;

coupling means, disposed between said first and second cavity resonator means, for electromagnetically coupling said second cavity resonator means with said first cavity resonator means, said coupling means comprising a coupling window having a coupling coefficient;

an adjusting screw, mounted in said bottom plate, for controlling the second resonant frequency of said second cavity resonator means; and an adjusting antenna, mounted in said bottom plate at a distance from said coupling window, for controlling the coupling coefficient of said coupling window between said first cavity resonator means and said second cavity resonator means by adjusting the distance between said adjusting antenna and said coupling window.

18. A cavity resonator coupling type power distributor/power combiner as set forth in claim 17, wherein said bottom plate has a first tapped hole with which said adjusting screw engages therewith and said adjusting screw has a second tapped hole with which said adjusting antenna engages therewith.

19. A cavity resonator coupling type power distributor/power combiner, selectable to function as one of a distributor and a combining unit in conjunction with multiple amplifiers, said power distributor/power combiner comprising:

first cavity resonator means, having a single coupling terminal, operatively resonating in a first transverse mode;

second cavity resonator means, having a plurality of coupling terminals, operatively resonating at a resonant frequency in a second transverse mode of a higher order than the first transverse mode, said second cavity resonator means comprising:

partial enclosure means for partially enclosing a cavity; and a bottom plate abutting said partial enclosure means for substantially completing enclosure of the cavity partially enclosed by said partial enclosure means;

coupling means, disposed between said first and second cavity resonator means, for electromagnetically coupling said second cavity resonator means with said first cavity resonator means with a coupling coefficient selected to provide a predetermined bandwidth, comprising a coupling window;

an adjusting screw, mounted in said bottom plate, for controlling the resonant frequency of said second cavity resonator means; and an adjusting antenna, mounted in said bottom plate at a distance from said coupling window, for controlling the coupling coefficient of said coupling window between said first cavity resonator means and said second cavity resonator means by adjusting the distance between said adjusting antenna and said coupling window.

20. A cavity resonator coupling type power distributor power combiner as set forth in claim 19, wherein said bottom plate has a first tapped hole with which said adjusting screw engages and said adjusting screw has a second tapped hole with which said adjusting antenna engages.

21. A cavity resonator coupling type power distributor/power combiner selectable to function as one of a distributor and a combining unit in conjunction with multiple amplifiers, said power distributor/power combiner comprising:

first cavity resonator means, having a center and a single coupling terminal, operatively resonating in a first transverse mode with a first resonant frequency:

second cavity resonator means, having a plurality of coupling terminals, operatively resonating in a second transverse mode of a higher order than the first transverse mode and with a second resonant frequency, different than the first resonant frequency; and coupling means, disposed between said first and second cavity resonator means, for electromagnetically coupling said second cavity resonator means with said first cavity resonator means, said coupling means comprising a coupling window having a diameter equal to the distance between two positions, where the intensity of the electric field in the first cavity resonator means has peak values, equidistant from the center of said first cavity resonator means, whereby mode coupling without generation of undesired modes is established between said first cavity resonator means and said second cavity resonator means.

22. A cavity resonator coupling type power distributor/power combiner selectable to function as one of a distributor and a combining uit in conjunction with multiple amplifiers, said power distributor/power combiner comprising:

a metal housing having cylindrical walls;

first cavity resonator means, formed by said metal housing, having a single coupling terminal and operatively resonating in a first transverse mode with a first resonant frequency;

second cavity resonator means, partially formed by said metal housing, having a plurality of coupling terminals and operatively resonating in a second transverse mode of a higher order than the first transverse mode and with a second resonant frequency, different than the first resonant frequency, said second cavity resonator means further comprising:

a metal plate disposed between and separating said first and second cavity resonator means, said metal plate being integral with said metal housing and having a center;

a bottom plate having a center, the cylindrical walls of said metal housing forming a substantially enclosed cavity in conjunction with said metal and bottom plates; and an adjusting screw, passing through the center of said bottom plate, for controlling the second resonant frequency of said second cavity resonator; and coupling means, disposed between said first and second cavity resonator means, for electromagnetically coupling said second cavity resonator means with said first cavity resonator means, said coupling means comprising:

a dielectric supporting member passing through the center of said metal plate and having a center; and a coupling rod passing through the center of said dielectric supporting member and having antennas at each end of said coupling rod for establising electric field coupling between said first cavity resonator means and said coupling rod and between said second cavity resonator means and said coupling rod.

23. A cavity resonator coupling type power distributor/power combiner selectable to function as one of a distributor and a combining unit in conjunction with multiple amplifiers, said power distributor/power combiner comprising:

first cavity resonator means, having a single coupling terminal, operatively resonating in a first transverse mode;

second cavity resonator means, having a plurality of coupling terminals and a bottom plate with a first tapped hole, operatively resonating in a second transverse mode of a higher order than the first transverse mode and with a resonant frequency;

a coupling window, opposite the bottom plate of said second cavity resonator means, coupling said first cavity resonator means and said second cavity resonator means with a coupling coefficient;

an adjusting screw, engaging with the first tapped hole in said bottom plate and having a hole therein, for controlling the resonant frequency of said second cavity resonator means;

an adjusting antenna, penetrating said adjusting screw through the hole therein to a distance from said coupling window, for controlling the coupling coefficient of said coupling window by adjusting the distance between said adjusting antenna and said coupling window; and a supporting member, affixed to the bottom plate of said second cavity resonator means, having a second tapped hole with which said adjusting antenna engages therewith.

24. A cavity resonator coupling type power distributor/power combiner, selectable to function as one of a distributor and a combining unit in conjunction with multiple amplifiers, said power distributor/power combiner comprising:

a metal housing having cylindrical walls;

first cavity resonator means, formed by said metal housing, having a single coupling terminal and operatively resonating in a first transverse mode;

second cavity resonator means, partially formed by said metal housing, having a plurality of coupling terminals, operatively resonating at a resonant frequency in a second transverse mode of a higher order than the first transverse mode, said second cavity resonator means further comprising:

a metal plate disposed between and separating said first cavity resonator means and said second cavity resonator means, said metal plate being integral with said metal housing and having a center;

a bottom plate having a center, the cylindrical walls of said metal housing forming a substantially enclosed cavity in conjunction with said metal and bottom plates; and an adjusting screw, passing through the center of said bottom plate, for controlling the resonant frequency of said second cavity resonator; and coupling means, disposed between said first and second cavity resonator means, for electromagnetically coupling said second cavity resonator means with said first cavity resonator means with a coupling coefficient selected to provide a predetermined bandwidth, said coupling means comprising:

a dielectric supporting member passing through the center of said metal plate and having a center; and a coupling rod passing through the center of said dielectric supporting member and having antennas at each end of said coupling rod for establishing electric field coupling between said first cavity resonator means and said coupling rod and between said second cavity resonator means and said coupling rod.

25. A cavity resonator coupling type power distributor/power combiner, selectable to function as one of a distributor and a combining unit in conjunction with multiple amplifiers, said power distributor/power combiner comprising:

first cavity resonator means having a center and a single coupling terminal, operatively resonating in a first transverse mode;

second cavity resonator means, having a plurality of coupling terminals, operatively resonating in a second transverse mode of a higher order than the first transverse mode; and coupling means, disposed between said first and second cavity resonator means, for electromagnetically coupling said second cavity resonator means with said first cavity resonator means with a coupling coefficient selected to provide a predetermined bandwidth, said coupling means comprising a coupling window having a diameter equal to the distance between two positions, where the intensity of the electric field in the first cavity resonator means has peak values, equidistant from the center of said first cavity resonator means, whereby mode coupling without generation of undesired modes is established between said first cavity resonator means and said second cavity resonator means.

* * * * *

UNITED STATES PATENT AND TRADEMARK OFFICE

CERTIFICATE OF CORRECTION

PATENT NO. : 4,686,494

DATED : August 11, 1987

INVENTOR(S) : Yoshiaki Kaneko et al.

It is certified that error appears in the above-identified patent and that said Letters Patent is hereby corrected as shown below:

Column 5, line 4, after "is" insert --designed--.
Column 7, line 26, delete "to" (second occurrence);
line 54, change "realised" to --realized--.
Column 9, line 14, "the" should be --an--;
line 15, after "with" insert --the axis of--.
Column 11, line 61, "uit" should be --unit--.

Signed and Sealed this

Twenty-ninth Day of March, 1988

*Attest:*

DONALD J. QUIGG

*Attesting Officer*

*Commissioner of Patents and Trademarks*